United States Patent [19]

Tigges

[11] Patent Number: 5,012,206
[45] Date of Patent: Apr. 30, 1991

[54] INDUCTIVE PROXIMITY SWITCH

[75] Inventor: Burkhard Tigges, Sundern, Fed. Rep. of Germany

[73] Assignee: Werner Turck GmbH & Co. KG, Halver, Fed. Rep. of Germany

[21] Appl. No.: 511,767

[22] Filed: Apr. 20, 1990

[30] Foreign Application Priority Data

Apr. 20, 1989 [DE] Fed. Rep. of Germany ....... 3912946

[51] Int. Cl.$^5$ .............................................. H03K 17/95
[52] U.S. Cl. ..................................... 331/65; 324/236; 324/327
[58] Field of Search ............. 331/65, 117 R; 324/236, 324/327

[56] References Cited

U.S. PATENT DOCUMENTS 4,879,531 11/1989 Tigges et al. ........................ 331/65

Primary Examiner—Robert J. Pascal
Attorney, Agent, or Firm—Antonelli, Terry, Stout & Kraus

[57] ABSTRACT

An inductive proximity switch in which a quartz oscillator is connected to a sensor resonant circuit having a sensor coil which is adapted to be influenced by the approach of electrically conductive nonmagnetic nonferrous metal (NF) objects and ferromagnetic metal (FE) objects. A detecting circuit detects when the sensor resonant circuit has an impedance which is indicative of either an NF object or an FE object at a predetermined switching distance from the sensor coil, thus causing the proximity switch to exhibit the same switching distance for both NF and FE objects. The oscillator frequency and the impedance of the sensor resonant circuit at the oscillator frequency are respectively set to be equal to a critical frequency and a critical impedance value at a critical response point defined by a point where impedance-frequency characteristic curves of the sensor resonant circuit under the influence of NF objects and FE objects at the predetermined switching distance intersect. The oscillator frequency and the natural resonant frequency of the sensor resonant circuit when it is uninfluenced by an approaching object are set to be slightly different from each other.

25 Claims, 4 Drawing Sheets

INDUCTIVE PROXIMITY SWITCH

BACKGROUND OF THE INVENTION

1. Field of the Invention

The present invention relates to a switch arrangement, and more particularly to an inductive proximity switch including an oscillator and a sensor resonant circuit which exhibits the same switching distance for both electrically conductive nonmagnetic nonferrous metal (NF) objects and ferromagnetic (FE) objects.

2. Description of Related Art

When an electrically conductive object approaches a coil, the effective inductance of the coil is reduced due to a mutual inductance between the coil and the object caused by electrical currents which are magnetically induced in the object. Furthermore, the quality Q of the coil is reduced due to ohmic losses in the object caused by the induced currents. These effects can be exploited in a proximity switch by detecting various events indicating the approach of an electrically conductive object. For example, it is possible to detect a decrease in the amplitude of an oscillator output, or a cessation of oscillation of an oscillator, due to damping of a sensor coil caused by the approach of an electrically conductive object. While it is possible to detect a change in *the frequency of an oscillator due to a decrease in the inductance of a sensor coil caused by the approach of an electrically conductive object, it is rare to do so.

When a coil is approached by a ferromagnetic object, i.e. an object having a very high magnetic permeability, in addition to the above-described effects resulting from the electrical conductivity of the object, the inductance of the coil is increased due to an increase in the reluctance of the coil caused by the ferromagnetic properties of the object. These effects can be exploited in a proximity switch in a manner similar to that described above.

The difference between the effects on a coil due to the approach of an electrically conductive nonmagnetic object, especially an object made of a nonferrous metal such as copper or aluminum, and the approach of an object made of a ferromagnetic metal, especially an object made of a ferrous metal, can be inconsequential in certain instances, such as when the proximity switch is only to be used to detect the approach of objects made of the same material. However, the difference between the effects can be useful in other instances, such as when the proximity switch is to be used to differentiate between approaching objects made of different materials, rather than merely to detect the approach of objects made of the same material. Finally, there are also instances where the difference between the effects can be disadvantageous, such as when the proximity switch is to be used to detect the approach of objects to a specific distance regardless of the material of which they are made, as is the case in the present invention.

An inductive proximity switch which exhibits the same switching distance for both electrically conductive nonmagnetic nonferrous metal (NF) objects and ferromagnetic metal (FE) objects has been proposed in West German Patentschrift DE 37 14 433 C1, corresponding to U.S. Pat. No. 4,879,531. This switch includes an LC oscillator having a frequency-determining resonant circuit and a sensor resonant circuit. The sensor resonant circuit exhibits different impedance-frequency characteristic curves for the approach of NF and FE objects to a predetermined switching distance. The curves for the NF and FE objects intersect at a critical response point corresponding to a critical frequency $f_0$ and a critical impedance $Z_0$. The resonant frequency of the frequency-determining resonant circuit is set to $f_0$ and the impedance of the sensor resonant circuit at $f_0$ is set to $Z_0$. The switch is triggered when the impedance of the sensor resonant circuit becomes equal to $Z_0$ due to the approach of either an NF object or an FE object to the predetermined switching distance. However, the LC oscillator used in this proposed switch is subject to marked frequency fluctuations which can result in different switching distances for NF and FE objects. As will be explained below, this problem is solved in the present invention by the use of an oscillator which is not subject to frequency fluctuations, such as an oscillator controlled by a ceramic or quartz resonator.

West German Patentschrift 32 21 888 and West German Offenlegungsschrift 33 20 509 propose proximity switches which exhibit different switching distances for NF and FE objects and which are made less sensitive to external influences such as moisture and temperature and to changes in the characteristics of switch components by regulating an oscillator frequency in accordance with the resonant frequency of a sensor resonant circuit. However, this technique cannot be used in the proximity switch of the present invention which exhibits the same switching distance for both NF and FE objects because, as will be explained below, a constant oscillator frequency must be maintained to achieve the same switching distance for both NF and FE objects. As will be explained below, the use of an oscillator controlled by a ceramic or quartz resonator makes the proximity switch of the present invention less sensitive to external influences.

SUMMARY OF THE INVENTION

The aim underlying the present invention essentially resides in providing an inductive proximity switch which exhibits the same switching distance for NF and FE objects, with the switch having an improved temperature stability and a reduced size.

In accordance with advantageous features of the present invention, an oscillator is controlled by a ceramic or quartz resonator, and for example may be a quartz oscillator. Such an oscillator has a frequency stability which is two to three orders of magnitude higher than the LC oscillator used in the proximity switch proposed in the aforementioned West German Patentschrift DE 37 14 433 C1. Therefore, the oscillator frequency in the proximity switch of the present invention can be maintained exactly at the critical frequency $f_0$, thereby eliminating frequency deviations which can cause different switching distances for NF and FE objects.

In accordance with further advantageous features of the present invention, a quartz oscillator has a high temperature stability and is usually encapsulated, thereby making it relatively insensitive to external influences such as atmospheric humidity while at the same time ensuring a high long-term stability and providing a relatively small size. This makes the proximity switch of the present invention less sensitive to external influences without the need to regulate the frequency of the oscillator as proposed in the aforementioned West German Patentschrift 32 21 888 and West German Offenlegungsschrift 33 20 509.

In accordance with further advantageous features of the present invention, the oscillator is loosely coupled to a sensor resonant circuit such that there is substantially no interaction between the oscillator and the sensor resonant circuit, thereby preventing the sensor resonant circuit from affecting the oscillator frequency. Furthermore, the natural resonant frequency of the undamped sensor resonant circuit and the oscillator frequency are set to be slightly different from each other, thereby shifting the operating point of the proximity switch from a peak region of the impedance-frequency characteristic curve of the sensor resonant circuit to a steep flank region of the curve, thus achieving a high response sensitivity.

In accordance with further advantageous features of the present invention, the impedance-frequency characteristic curve of the sensor resonant circuit depends on its dimensions and the effects of changes in its characteristics caused by the approach of NF and FE objects. When the sensor resonant circuit is suitably dimensioned, the impedance-frequency characteristic curve for NF objects located at a predetermined switching distance intersects with the impedance-frequency characteristic curve for FE objects located at the same predetermined switching distance at a critical response point corresponding to a critical frequency $f_0$ and a critical impedance $Z_0$. If the dimensions of the sensor resonant circuit are selected such that its impedance at $f_0$ is equal to $Z_0$ and the oscillator frequency is set equal to $f_0$, a detecting circuit can be set to detect when the impedance of the sensor resonant circuit is equal to $Z_0$ to provide a proximity switch which exhibits the same switching distance for both NF and FE objects.

It is especially advantageous in accordance with the present invention to incorporate the sensor resonant circuit in an active bandpass filter. This makes it possible to use a very weak oscillator signal, and to set the bandpass characteristic of the filter within wide limits. The response sensitivity of the proximity switch can thus be considerably increased while deviations in the switching distance are simultaneously decreased.

In accordance with further advantageous features of the present invention, since the impedance of the sensor resonant circuit is to be equal to $Z_0$ at the oscillator frequency $f_0$, i.e. when the sensor resonant circuit is influenced by an NF or FE object at the predetermined switching distance, the natural resonant frequency of the sensor resonant circuit, i.e. when the sensor resonant circuit is uninfluenced by an approaching object, must be slightly different from the oscillator frequency. To make the impedance of the sensor resonant circuit at $f_0$ be equal to $Z_0$, either the oscillator frequency or the natural resonant frequency of the sensor resonant circuit can be adjusted. To obtain a frequency suitable for use with the sensor resonant circuit, the oscillator frequency can be scaled down with a frequency divider.

In accordance with further advantageous features of the present invention, the impedance $Z_0$ of the sensor resonant circuit at the oscillator frequency $f_0$ and the detecting value of the detecting circuit can be made equal to each other by at least one of adjusting the detecting value of the detecting circuit, adjusting the amplification of the bandpass filter if one is used, adding resistance to the impedance of the sensor resonant circuit to change the quality Q of the sensor resonant circuit, adjusting the amplitude of the oscillator output, and adjusting the value of the coupling impedance between the oscillator and the sensor resonant circuit.

The above and other objects, features, and advantages of the present invention will become more apparent from the following description when taken in connection with the accompanying drawings which show, for the purpose of illustration only, several embodiments in accordance with the present invention.

DESCRIPTION OF THE PREFERRED EMBODIMENTS

Figure 1:
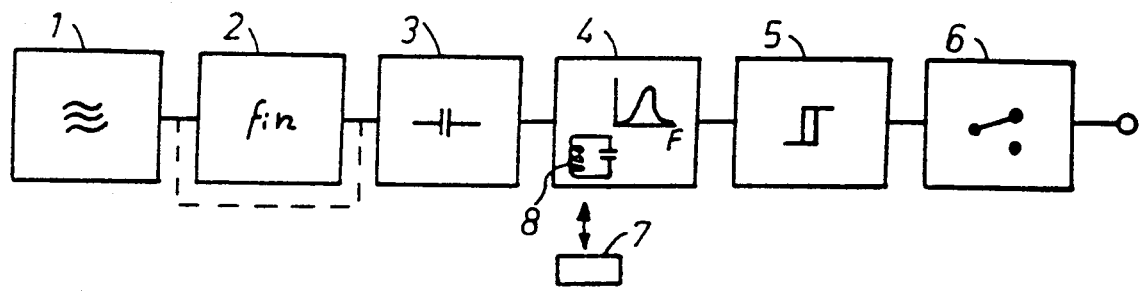
FIG. 1 is a block circuit diagram of a proximity switch in accordance with the present invention.

Referring now to the drawings wherein like reference numerals are used throughout the various figures to designate like parts, and more particularly to FIG. 1, an oscillator 1 of any desired type, but advantageously a quartz oscillator, is connected to a coupling unit 3 either directly as shown by the dashed line or indirectly via a fixed or adjustable frequency divider 2. Coupling unit 3 couples oscillator 1 to a sensor resonant circuit 4 and can be of of any desired type, but is preferably an impedance coupling unit such as those shown in FIGS. 3a–3d for loosely coupling oscillator 1 to sensor resonant circuit 4 such that there is substantially no interaction between oscillator 1 and sensor resonant circuit 4. Sensor resonant circuit 4 produces an output signal which depends on the degree of coupling effected by coupling unit 3 and the impedance of sensor resonant circuit 4. This output signal is detected by level detector 5, and the detected output signal is converted by switching circuit 6 into a proximity switch output signal. The impedance of sensor resonant circuit 4 is influenced by the approach of an object 7 in the manner described above, and the output signal of the proximity switch is triggered when the object approaches to a specific distance.

Sensor resonant circuit 4 can be a simple LC resonant circuit including a sensor coil 8 and a capacitor 9 which detects the approach of object 7. Sensor coil 8 is adapted to be influenced by the approach of object 7. However, it is particularly advantageous to incorporate sensor resonant circuit 4 into an active narrow-band bandpass filter as shown in FIG. 3e. Such an arrangement makes the response sensitivity of the proximity switch especially stable, and makes it possible to use a low-power oscillator.

Figure 2:
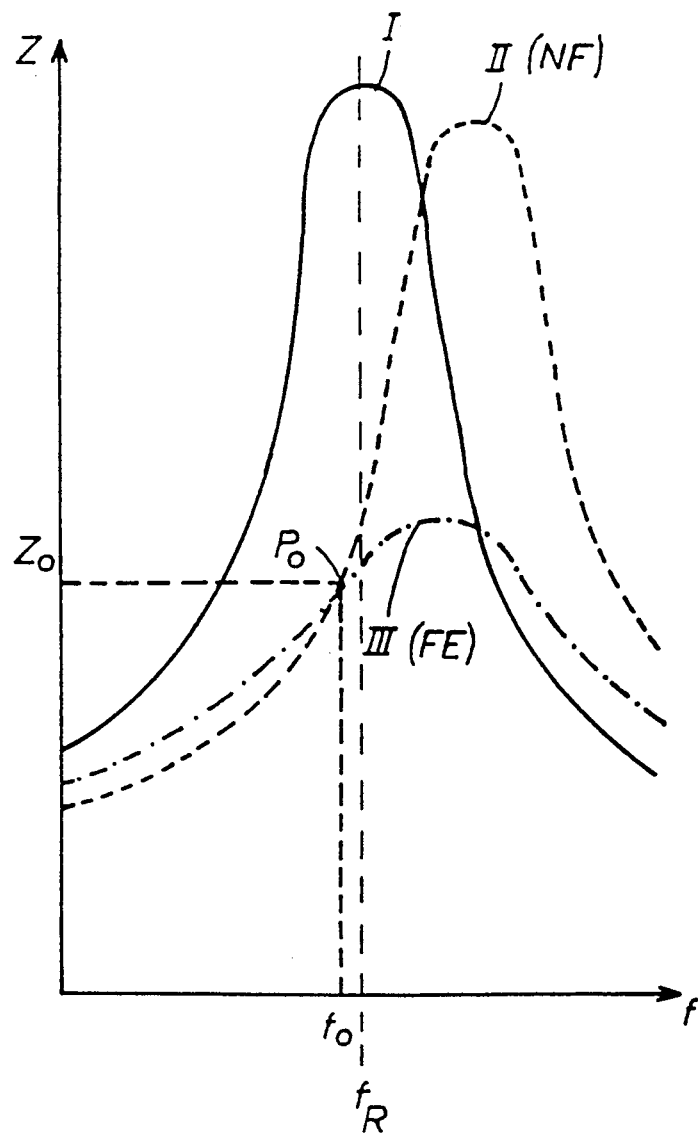
FIG. 2 is a graphical illustration of impedance-frequency characteristic curves of a sensor resonant circuit.

FIG. 2 shows impedance-frequency characteristic curves of sensor resonant circuit 4 under various conditions. Curve I shows the characteristic of sensor resonant circuit 4 when it is uninfluenced by an external object. The peak of curve I defines the natural resonant frequency $f_R$ of sensor resonant circuit 4. Curve II shows the characteristic of sensor resonant circuit 4 when it is influenced by an NF object located at a predetermined switching distance. Finally, curve III shows the characteristic of sensor resonant circuit 4 when it is influenced by an FE object located at the same predetermined switching distance. The resonant frequency and the maximum impedance value of sensor resonant circuit 4 are altered by the influence of the NF and FE objects. Curves II and III intersect at a critical response point $P_0$ corresponding to a critical frequency $f_0$ and a critical impedance $Z_0$. If sensor resonant circuit 4 is excited at the frequency $f_0$ and level detector 5 is set to detect the impedance value $Z_0$, the proximity switch will exhibit the same switching distance for both NF and FE objects.

Figure 3A:
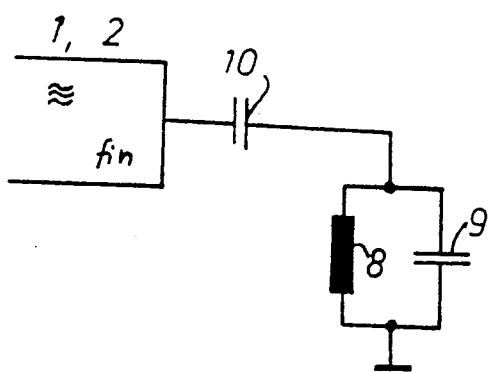
FIGS. 3a–3d are schematic illustrations of alternative methods of coupling a sensor resonant circuit to an oscillator.
Figure 3B:
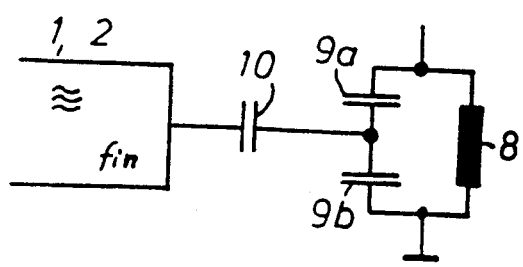
Figure 3C:
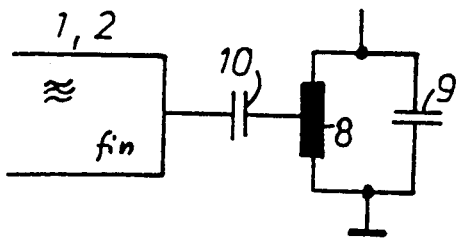
Figure 3D:
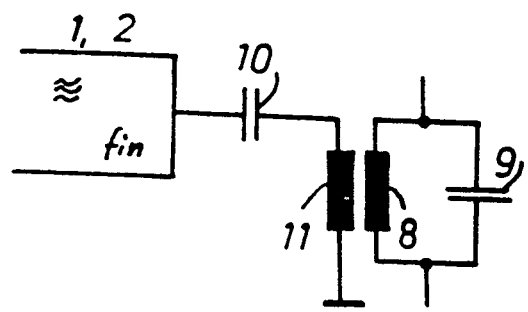
Figure 3E:
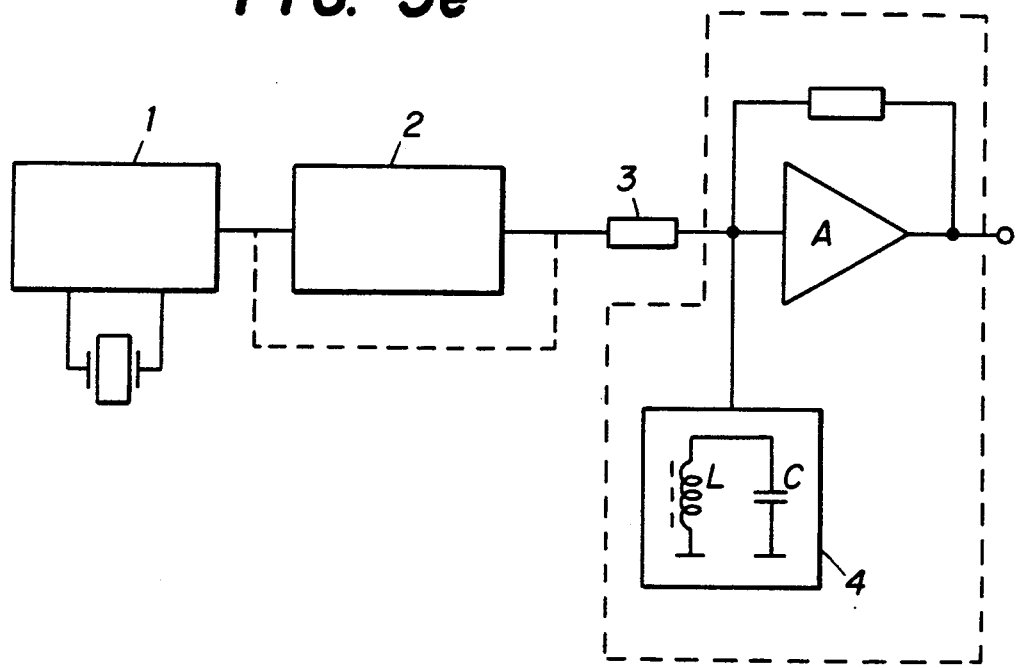
FIGS. 3e–3f are schematic illustrations of alternative methods of incorporating a sensor resonant circuit in an active bandpass filter.

FIGS. 3a–3d show methods of coupling oscillator 1 to sensor resonant circuit 4 with coupling unit 3 either directly or indirectly via frequency divider 2. Coupling unit 3 is preferably selected to loosely couple oscillator 1 to sensor resonant circuit 4 such that there is substantially no interaction between oscillator 1 and sensor resonant circuit 4. FIG. 3a shows a simple capacitive coupling. Sensor coil 8 and capacitor 9 constitute sensor resonant circuit 4, which may also be part of an active narrow-band bandpass filter as shown in FIG. 3e. Capacitor 10 constitutes coupling unit 3. FIG. 3b shows a capacitive coupling where sensor coil 8 and capacitors 9a and 9b constitute sensor resonant circuit 4. Capacitor 10 constitutes coupling unit 3, and couples sensor resonant circuit 4 to oscillator 1 between capacitors 9a and 9b. FIG. 3c shows a capacitive coupling where capacitor 10 is connected to a tap in sensor coil 8. FIG. 3d shows an inductive coupling where capacitor 10 is connected to an excitation coil 11 which is magnetically coupled to sensor coil 8.

Figure 3F:
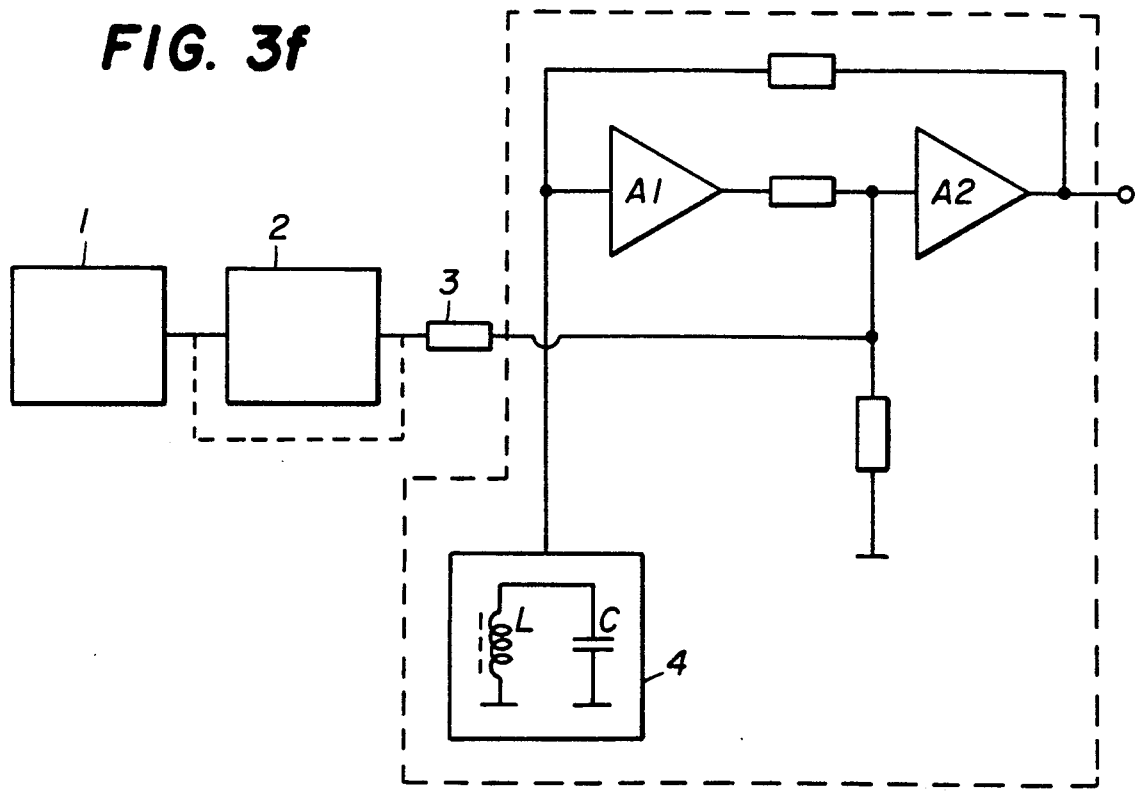

If sensor resonant circuit 4 is incorporated in an active narrow-band bandpass filter, it can also be excited at a suitable location in the amplifier stage of the filter as shown in FIG. 3f.

Figure 4:
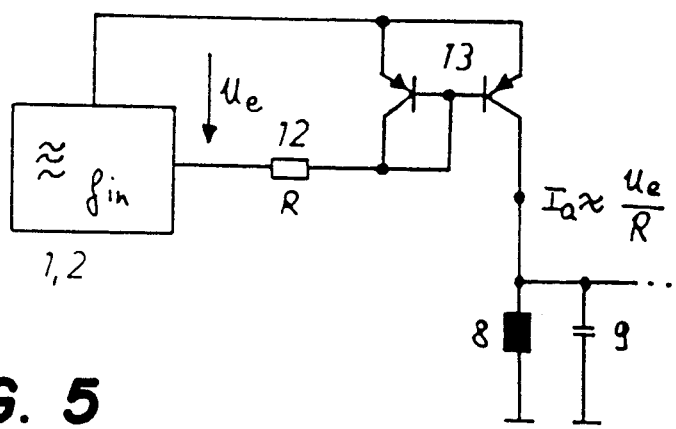
FIG. 4 is a schematic illustration of another method of coupling a sensor resonant circuit to an oscillator using a voltage-current transformer.

FIG. 4 shows another method for coupling sensor resonant circuit 4 constituted by sensor coil 8 and capacitor 9 to oscillator 1. An output voltage $V_e$ of oscillator 1 or frequency divider 2 is coupled to sensor resonant circuit 4 via a resistor 12 and a voltage-current transformer constituted by transistors 13. The voltage-current transformer converts the output voltage $V_e$ into a current $I_a$ which is proportional to $V_e$. Sensor resonant circuit 4 is then excited by current $I_a$. This coupling method has an amplifying effect, and provides an especially small degree of interaction between oscillator 1 and sensor resonant circuit 4. Due to the amplification provided by transistors 13, a very low power oscillator can be used as oscillator 1.

Figure 5:
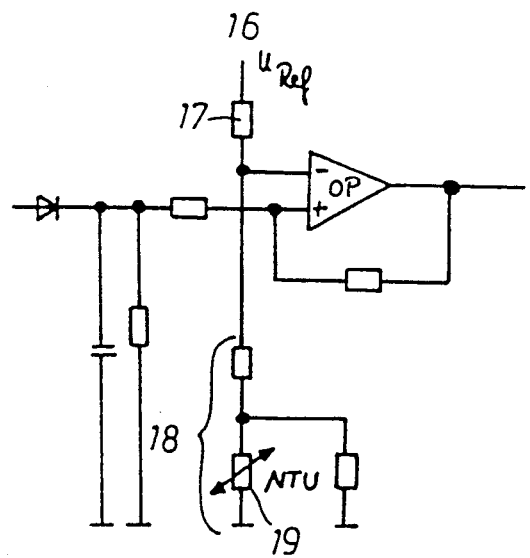
FIGS. 5–6 are schematic illustrations of alternative methods of performing temperature compensation of level detector in FIG. 1.
Figure 6:
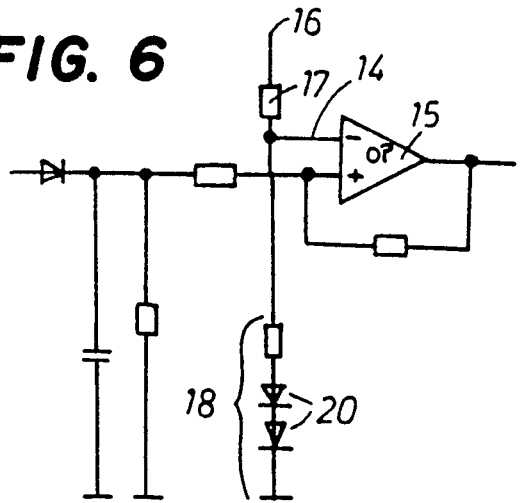

FIGS. 5–6 show methods of performing temperature compensation of level detector 5 in FIG. 1. The detecting value of level detector 5 is determined by the voltage applied to negative input 14 of operational amplifier 15. This voltage is determined by a reference voltage $V_{ref}$ and a voltage divider constituted by a resistor 17 and a resistance assembly 18 which includes a temperature-dependent component. In FIG. 5, the temperature-dependent component is a temperature-dependent resistor 19 primarily having a negative temperature coefficient. In FIG. 6, the temperature-dependent component is one or more temperature-dependent semiconductor devices 20. The embodiment of FIG. 6 is especially useful when temperature-dependent characteristics of other semiconductor devices in the proximity switch are also to be compensated. The use of these temperature-dependent components improves the performance of the proximity switch by eliminating, to the extent possible, the systematic temperature dependency of the triggering point of the switch.

While I have shown and described several embodiments of an inductive proximity switch according to the present invention, it is understood that the invention is not limited to the details shown and described herein, but is susceptible to numerous modifications as known to one of ordinary skill in the art. Therefore, I do not wish to be limited to the details shown and described herein, but intend to cover all such modifications as are encompassed by the scope of the appended claims.

What is claimed:

1. An inductive proximity switch comprising:
    oscillator means for producing an oscillator output signal having a substantially constant frequency and a substantially constant amplitude;
    sensor resonant circuit means adapted to be influenced by the approach of electrically conductive nonmagnetic nonferrous (NF) objects and ferromagnetic (FE) objects, and having a natural resonant frequency when it is uninfluenced by the approach of an object; and
    coupling means for loosely coupling the oscillator output signal to the sensor resonant circuit means such that there is substantially no interaction between the oscillator means and the sensor resonant circuit means;
    wherein the frequency of the oscillator output signal and the natural resonant frequency of the sensor resonant circuit means are set to deviate from each other by a predetermined frequency deviation.

2. An inductive proximity switch according to claim 1, wherein the oscillator means comprises an oscillator controlled by a ceramic or quartz resonator.

3. An inductive proximity switch according to claim 2, wherein the oscillator means further comprises frequency divider means for receiving an output signal of the oscillator and for producing the oscillator output signal.

4. An inductive proximity switch according to claim 3, wherein the frequency divider means is an adjustable frequency divider means.

5. An inductive proximity switch according to claim 1, wherein the sensor resonant circuit means has an impedance which changes as the sensor resonant circuit means is influenced by the approach of an object;
    wherein the impedance of the sensor resonant circuit means is defined by a first impedance-frequency characteristic curve when the senor resonant circuit means is influenced by an NF object which has approached to a predetermined distance from the sensor resonant circuit means;
    wherein the impedance of the sensor resonant circuit means is defined by a second impedance-frequency characteristic curve when the sensor resonant circuit means is influenced by an FE object which has approached to the predetermined distance from the sensor resonant circuit means; and
    wherein the first and second impedance-frequency characteristic curves intersect at a critical response point corresponding to a critical impedance and a critical frequency.

6. An inductive proximity switch according to claim 5, further comprising:

detecting means connected to the sensor resonant circuit means for detecting when the impedance of the sensor resonant circuit means is equal to a predetermined impedance; and switching means connected to the detecting means for producing a proximity switch output signal when the detecting means detects that the impedance of the sensor resonant circuit means is equal to the predetermined impedance;

wherein the frequency of the oscillator output signal is set to be equal to the critical frequency and the predetermined impedance is set to be equal to the critical impedance, thereby causing the proximity switch to exhibit the same switching distance for both NF and FE objects.

7. An inductive proximity switch according to claim 6, wherein the predetermined frequency deviation is set to be equal to a difference between the natural resonant frequency of the sensor resonant circuit means and the critical frequency.

8. An inductive proximity switch according to claim 1, further comprising:

detecting means connected to the sensor resonant circuit means for detecting when the impedance of the sensor resonant circuit means is equal to a predetermined impedance; and switching circuit means connected to the detecting means for producing a proximity switch output signal when the detecting means detects that the impedance of the sensor resonant circuit means is equal to the predetermined impedance.

9. An inductive proximity switch according to claim 8, wherein the predetermined impedance to be detected by the detecting means is adjustable.

10. An inductive proximity switch according to claim 8, wherein the detecting means has a temperature-dependent detecting characteristic, and further comprising temperature-compensation means for compensating for the temperature-dependent detecting characteristic of the detecting means, wherein the temperature-compensation means comprises at least one temperature-dependent element having a temperature-dependent characteristic which is opposite to the temperature-dependent detecting characteristic of the detecting means.

11. An inductive proximity switch according to claim 10, wherein the at least one temperature-dependent element comprises temperature-dependent resistance means having a substantially negative temperature-dependent resistance characteristic.

12. An inductive proximity switch according to claim 10, wherein the at least one temperature-dependent element comprises at least one semiconductor element.

13. An inductive proximity switch according to claim 12, wherein at least one of the oscillator means, the sensor resonant circuit means, the coupling means, the detecting means, and the switching means comprises at least one semiconductor device having a temperature-dependent characteristic, and wherein the temperature-compensation means also serves to compensate for the temperature-dependent characteristic of the at least one semiconductor device.

14. An inductive proximity switch according to claim 1, wherein the sensor resonant circuit means comprises an active narrow-band bandpass filter.

15. An inductive proximity switch according to claim 14, wherein the active narrow-band bandpass filter comprises an amplifier stage having an adjustable amplification.

16. An inductive proximity switch according to claim 1, wherein the sensor resonant circuit means comprises a sensor coil adapted to be influenced by the approach of NF and FE objects.

17. An inductive proximity switch according to claim 16, wherein the coupling means comprises a coupling capacitor.

18. An inductive proximity switch according to claim 17, wherein the sensor resonant circuit means further comprises two capacitors connected in series across the sensor coil, and wherein the coupling capacitor is connected to the sensor resonant circuit means between the series-connected capacitors.

19. An inductive proximity switch according to claim 17, wherein the sensor coil has a tap, and wherein the coupling capacitor is connected to the tap of the sensor coil.

20. An inductive proximity switch according to claim 17, wherein the coupling means further comprises an excitation coil magnetically coupled to the sensor coil, and wherein the coupling capacitor is connected to the excitation coil.

21. An inductive proximity switch according to claim 1, wherein the coupling means comprises a voltage-current transformer.

22. An inductive proximity switch according to claim 1, wherein the frequency of the oscillator output signal is adjustable.

23. An inductive proximity switch according to claim 1, wherein the amplitude of the oscillator output signal is adjustable.

24. An inductive proximity switch according to claim 1, wherein the natural resonant circuit frequency of the sensor resonant circuit means is adjustable.

25. An inductive proximity switch according to claim 1, wherein the sensor resonant circuit means has a quality Q, and comprises means for connecting fixed or adjustable resistance means to adjust the quality Q.

* * * * *